(12) United States Patent
Lee et al.

(10) Patent No.: US 11,489,100 B2
(45) Date of Patent: Nov. 1, 2022

(54) HEAT CONVERSION APPARATUS

(71) Applicant: LG INNOTEK CO., LTD., Seoul (KR)

(72) Inventors: Un Hak Lee, Seoul (KR); Jong Hyun Kang, Seoul (KR); Seong Jae Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 126 days.

(21) Appl. No.: 16/769,092

(22) PCT Filed: Dec. 4, 2018

(86) PCT No.: PCT/KR2018/015241
§ 371 (c)(1),
(2) Date: Jun. 2, 2020

(87) PCT Pub. No.: WO2019/112288
PCT Pub. Date: Jun. 13, 2019

(65) Prior Publication Data
US 2021/0234082 A1 Jul. 29, 2021

(30) Foreign Application Priority Data

Dec. 4, 2017 (KR) .................. 10-2017-0165257

(51) Int. Cl.
H01L 35/32 (2006.01)
H01L 35/30 (2006.01)
H01L 23/367 (2006.01)

(52) U.S. Cl.
CPC ............ H01L 35/32 (2013.01); H01L 23/367 (2013.01); H01L 35/30 (2013.01)

(58) Field of Classification Search
CPC .................................. H01L 35/32; H01L 35/30
See application file for complete search history.

(56) References Cited

U.S. PATENT DOCUMENTS 9,343,648 B2 5/2016 Gille et al.
2011/0032679 A1 2/2011 Baek et al.
(Continued)

FOREIGN PATENT DOCUMENTS

EP 2713412 4/2014
JP 2009-081970 4/2009
(Continued)

OTHER PUBLICATIONS

European Search Report dated Apr. 12, 2021 issued in Application No. 18885320.4.
(Continued)

Primary Examiner — Bethany L Martin
(74) Attorney, Agent, or Firm — Ked & Associates LLP

(57) ABSTRACT

A heat conversion apparatus according to one embodiment of the present invention comprises: a duct through which cooling fluid passes; a first thermoelectric module disposed on a first surface of the duct; a second thermoelectric module disposed on a second surface, which is disposed in parallel to the first surface, of the duct; and a gas guide member disposed above a third surface disposed between the first surface and the second surface of the duct so as to be spaced from the third surface, wherein the gas guide member includes one end thereof coming in contact with the first thermoelectric module, the other end thereof coming in contact with the second thermoelectric module, and an extended part for connecting the one end and the other end, and the gas guide member can have a form in which the distance thereof from the third surface gradually increases toward the center between the one end and the other end.

10 Claims, 7 Drawing Sheets

(56) References Cited

U.S. PATENT DOCUMENTS

| | | | |
|---|---|---|---|
| 2011/0067742 A1* | 3/2011 | Bell | H01L 35/00 |
| | | | 136/204 |
| 2011/0239635 A1 | 10/2011 | Prior et al. | |
| 2015/0333246 A1* | 11/2015 | Lee | H01L 35/30 |
| | | | 136/205 |
| 2016/0035957 A1 | 2/2016 | Casey | |
| 2018/0080363 A1* | 3/2018 | Ganz | F01N 5/025 |

FOREIGN PATENT DOCUMENTS

| | | |
|---|---|---|
| KR | 10-2010-0031015 | 3/2010 |
| KR | 10-2011-0015160 | 2/2011 |
| KR | 10-2014-0145794 | 12/2014 |
| KR | 10-2015-0025961 | 3/2015 |
| KR | 10-2015-0132209 | 11/2015 |
| WO | WO 2015/111459 | 7/2015 |

OTHER PUBLICATIONS

International Search Report dated Feb. 21, 2019 issued in Application No. PCT/KR2018/015241.
Korean Office Action dated Jan. 18, 2021 issued in Application No. 10-2020-0035659.

* cited by examiner

[FIG. 1]
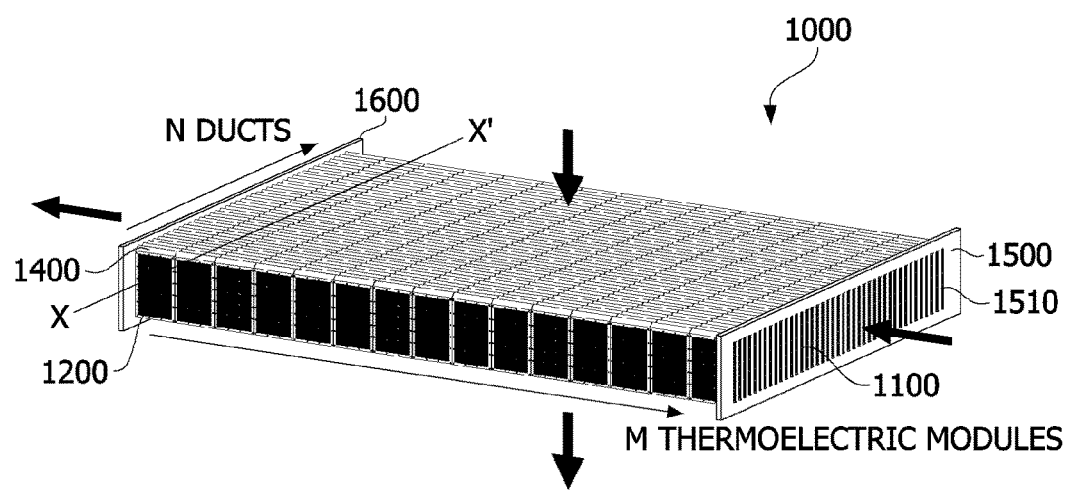
[FIG. 2]
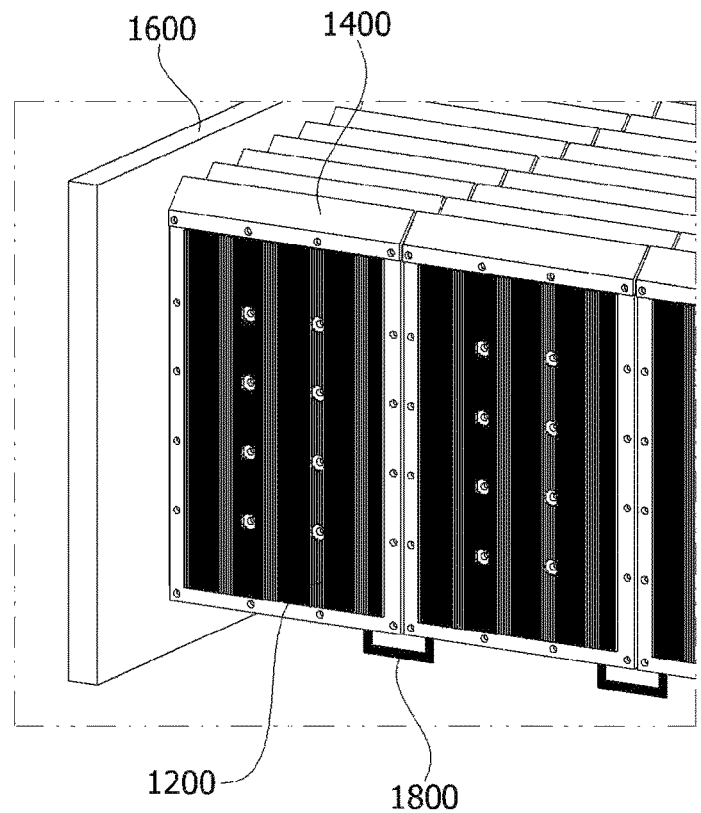

[FIG. 3]
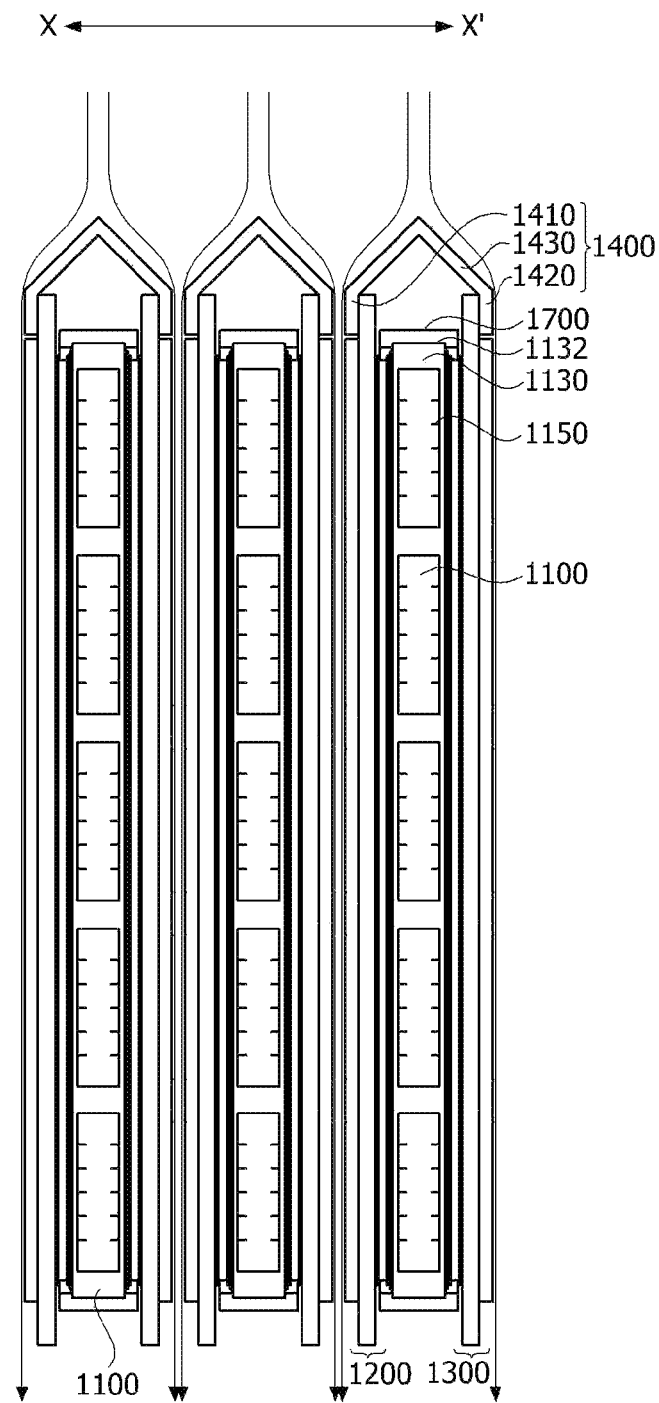

[FIG. 4]
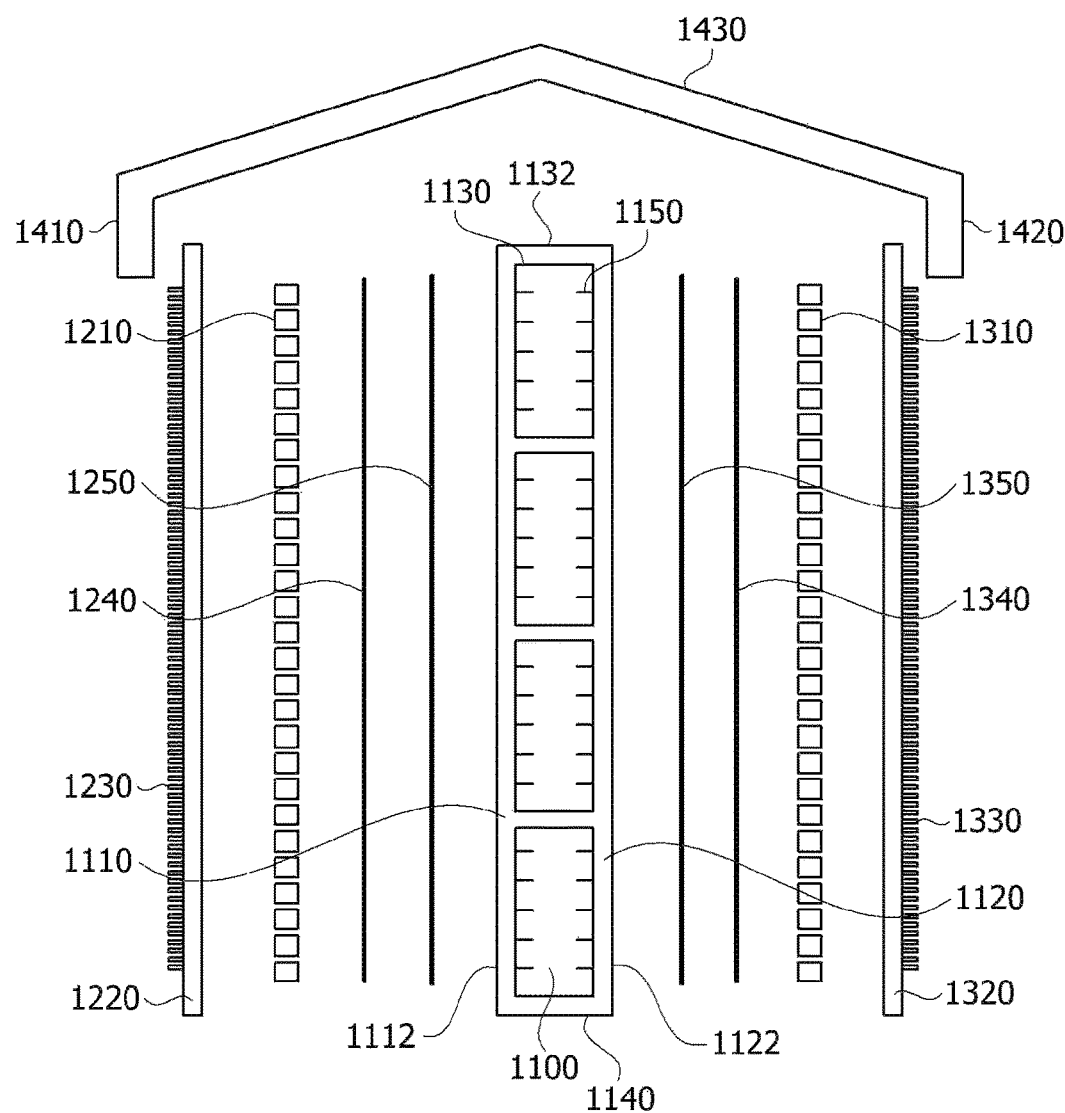

[FIG. 5]
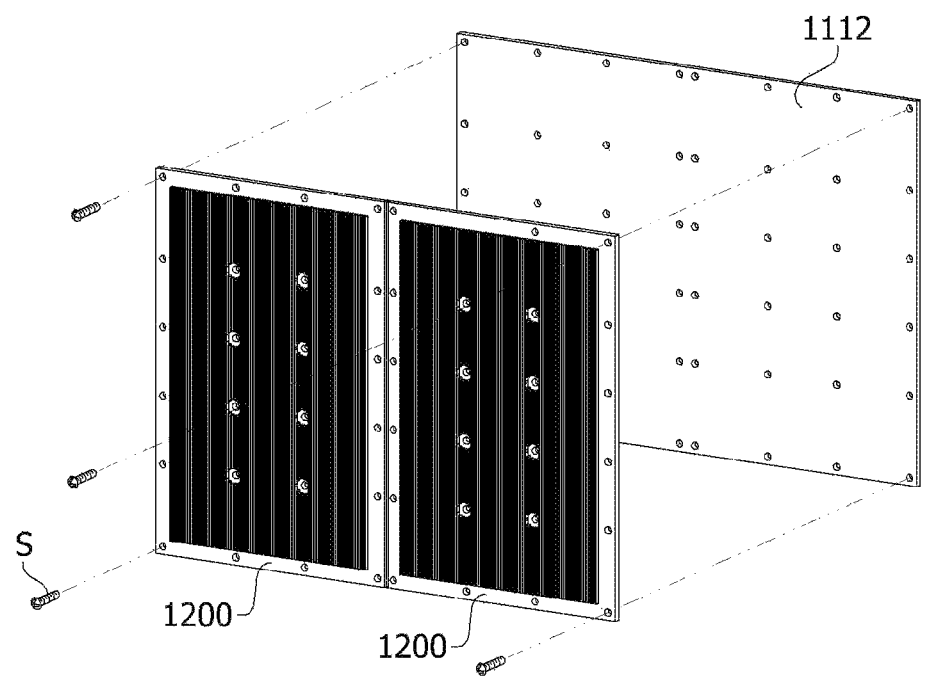

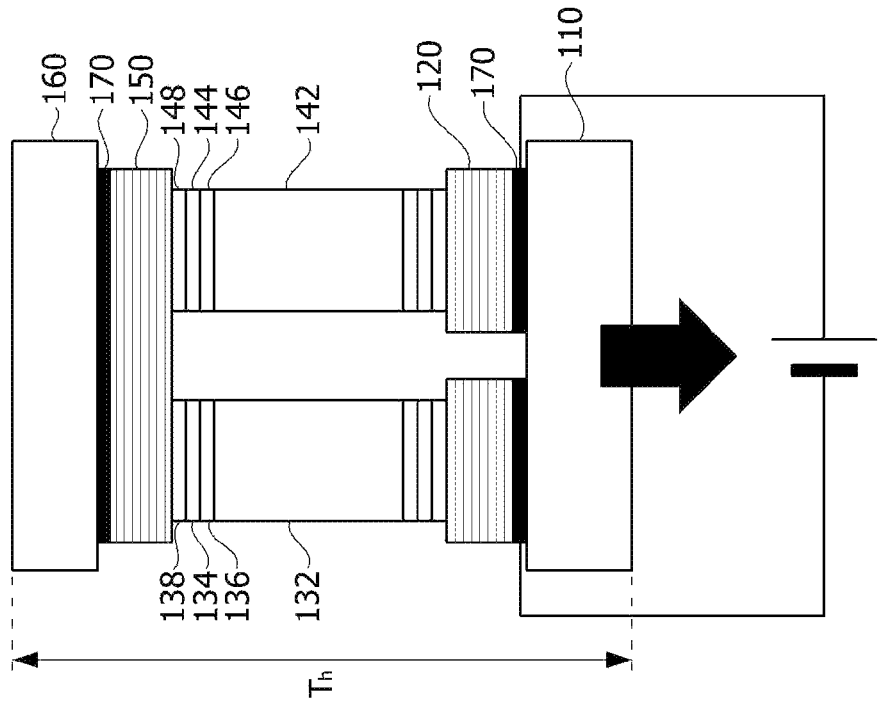
[FIG. 6A]
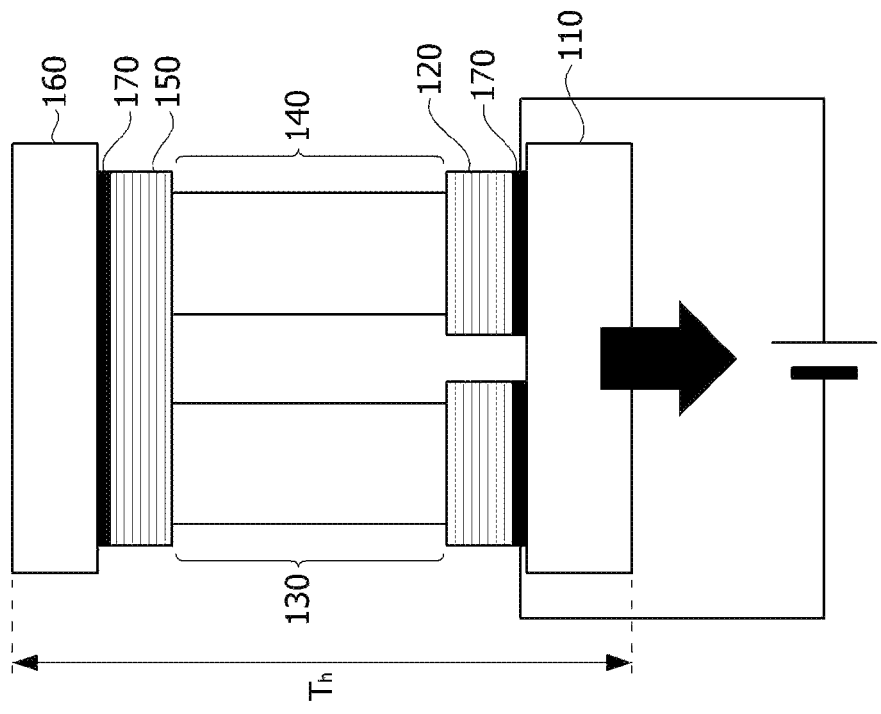
[FIG. 6B]

[FIG. 7]
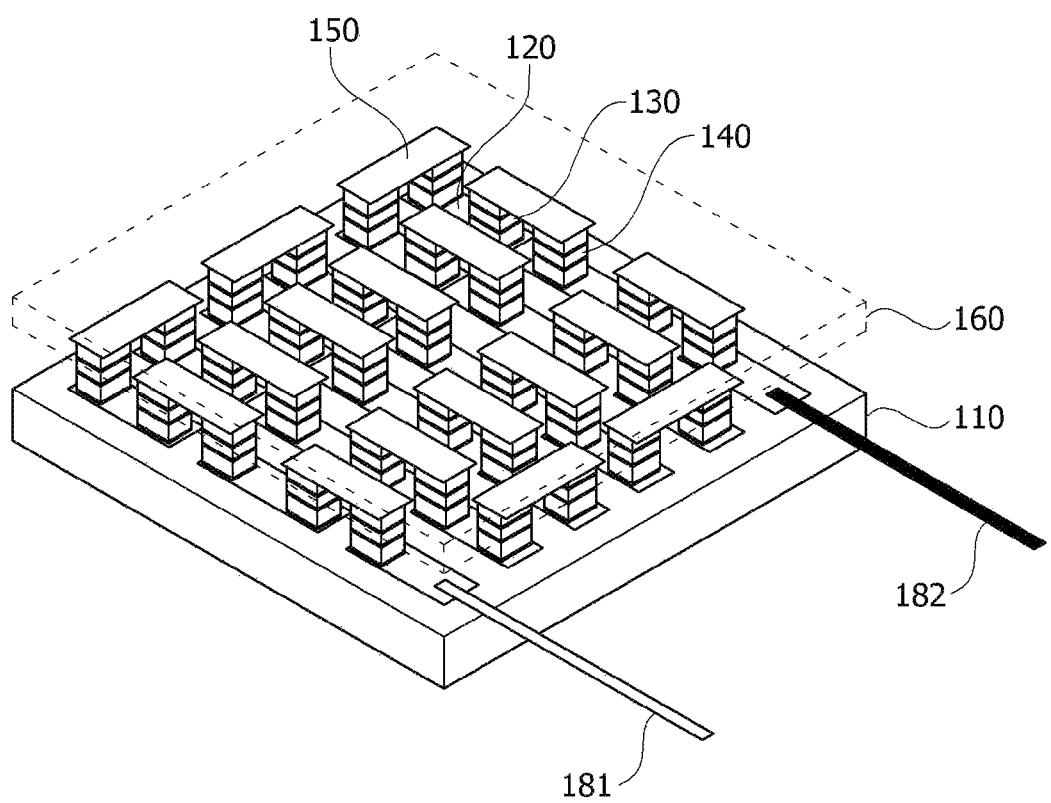

[FIG. 8A]
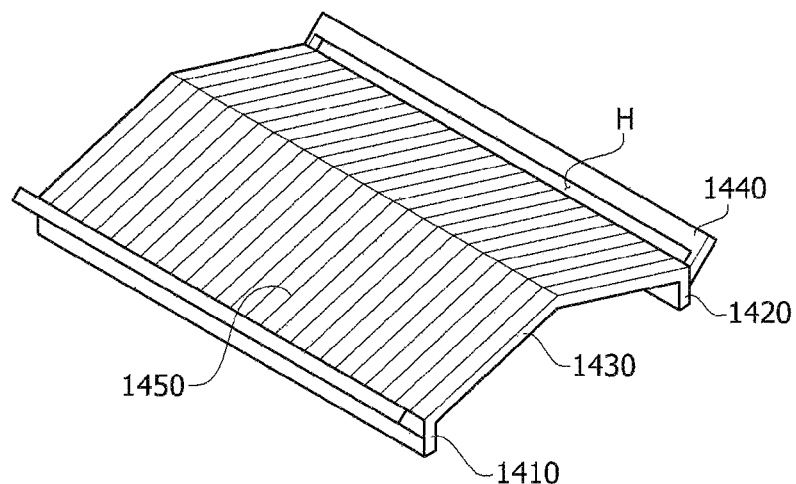
[FIG. 8B]
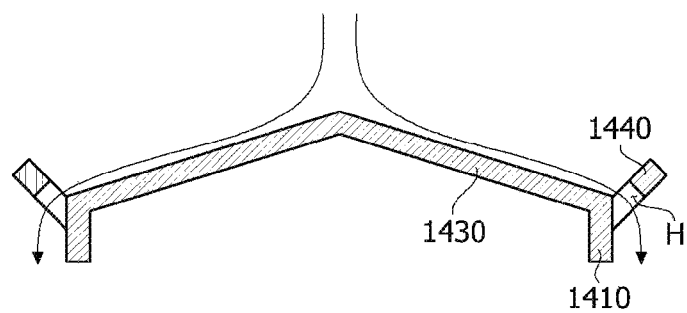
[FIG. 8C]
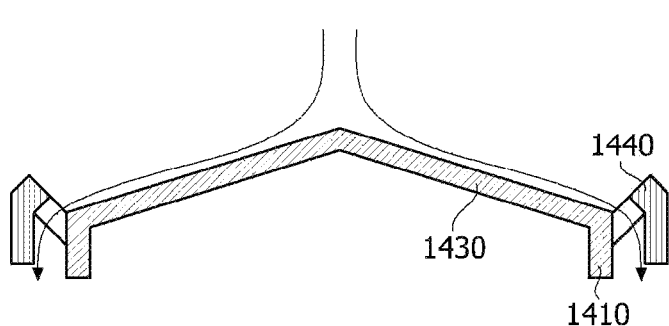

HEAT CONVERSION APPARATUS

CROSS-REFERENCE TO RELATED PATENT APPLICATIONS

This application is a U.S. National Stage Application under 35 U.S.C. § 371 of PCT Application No. PCT/KR2018/015241, filed Dec. 4, 2018, which claims priority to Korean Patent Application No. 10-2017-0165257, filed Dec. 4, 2017, whose entire disclosures are hereby incorporated by reference.

TECHNICAL FIELD

The present invention relates to a heat conversion apparatus, and more particularly, to a heat conversion apparatus which generates power using heat from a high-temperature gas.

BACKGROUND ART

A thermoelectric effect is a phenomenon caused due to movements of electrons and holes in a material and means direct energy conversion between heat and electricity.

A thermoelectric element is a generic term for a device which uses a thermoelectric effect and has a structure in which a P-type thermoelectric material and an N-type thermoelectric material are disposed between metal electrodes and bonded to form a pair of PN junctions.

The thermoelectric element may be classified into an element using a temperature variation in electrical resistance, an element using the Seebeck effect in which an electromotive force is generated due to a temperature difference, an element using the Peltier effect which is a phenomenon in which heat absorption or heat radiation occurs due to a current and the like.

Thermoelectric elements are widely applied to household appliances, electronic parts, and communication parts. For example, the thermoelectric elements may be applied to cooling devices, heating devices, power generation devices, and the like. Accordingly, the demand for thermoelectric performance of the thermoelectric elements is gradually increasing.

Recently, there is a need to generate electricity using thermoelectric elements and waste heat generated from engines of vehicles, ships, and the like. In this case, a structure for improving power generation performance is required.

DISCLOSURE

Technical Problem

The present invention is directed to providing a heat conversion apparatus which generates power using waste heat.

Technical Solution

One aspect of the present invention provides a heat conversion apparatus including a duct through which a cooling fluid passes, a first thermoelectric module disposed on a first surface of the duct, a second thermoelectric module disposed on a second surface which is disposed parallel to the first surface of the duct, and a gas guide member disposed on a third surface disposed between the first surface and the second surface of the duct to be spaced apart from the third surface, wherein the gas guide member includes one end in contact with the first thermoelectric module, the other end in contact with the second thermoelectric module, and an extension part connecting the one end to the other end, and wherein the gas guide member has a shape in which a distance from the third surface is increased toward a center between the one end and the other end.

The first thermoelectric module and the second thermoelectric module may include thermoelectric elements disposed on the first surface and the second surface, heat radiation substrates disposed on the thermoelectric elements, and heat sinks disposed on the heat radiation substrates; and each of the thermoelectric elements may include a plurality of first electrodes, a plurality of second electrodes, and a plurality of P-type thermoelectric legs and a plurality of N-type thermoelectric legs which are disposed between the plurality of first electrodes and the plurality of second electrodes.

Aluminum substrates may further be included between each of the first and second surfaces and the thermoelectric elements, and the aluminum substrates may be bonded to the first surface and the second surface using thermal interface materials (TIMs).

The one end of the gas guide member may be connected to at least one heat sink of the first thermoelectric module, and the other end of the gas guide member may be connected to at least one heat sink of the second thermoelectric module; a central portion of the extension part may have a predetermined angle; and the predetermined angle of a central portion may be smaller than an angle between the one end and the extension.

An air gap may be formed between the gas guide member and the third surface.

An insulating member may be disposed between the gas guide member and the third surface.

The first thermoelectric module and the second thermoelectric module may be engaged with the duct using a screw.

A heat dissipation fin may be disposed on an inner wall of the duct.

Advantageous Effects

In accordance with embodiments of the present invention, a heat conversion apparatus with excellent power generation performance can be provided. In particular, in accordance with the embodiments of the present invention, it is possible to provide a heat conversion apparatus which is easily assembled and has excellent power generation performance by reducing the number of parts being used and an occupying volume. In addition, in accordance with the embodiments of the present invention, a heat conversion apparatus with improved heat transfer efficiency to thermoelectric elements can be provided. Further, in accordance with the embodiments of the present invention, a power generation capacity can be controlled by adjusting the number of unit thermoelectric modules and the number of ducts.

DESCRIPTION OF DRAWINGS

FIG. 1 is a perspective view illustrating a heat conversion apparatus according to one embodiment of the present invention.

FIG. 2 is a partially enlarged view illustrating the heat conversion apparatus according to one embodiment of the present invention.

FIG. 3 is a cross-sectional view taken along line X-X' of FIG. 1.

FIG. 4 is an exploded view illustrating a unit module of FIG. 3.

FIG. 5 is a diagram for describing a structure in which a thermoelectric module is engaged with a duct.

FIGS. 6A and 6B are cross-sectional views illustrating a thermoelectric element included in the thermoelectric module according to one embodiment of the present invention.

FIG. 7 is a perspective view illustrating the thermoelectric element included in the thermoelectric module according to one embodiment of the present invention.

FIGS. 8A, 8B and 8C show a perspective view and a cross-sectional view illustrating a gas guide member according to another embodiment of the present invention.

MODES OF THE INVENTION

The present invention may be modified into various forms and may have a variety of embodiments, and, therefore, specific embodiments will be illustrated in the accompanying drawings and described. The embodiments, however, are not to be taken in a sense which limits the present invention to the specific embodiments and should be construed to include modifications, equivalents, or substituents within the spirit and technical scope of the present invention.

Also, terms including ordinal numbers such as first, second, and the like used herein may be used to describe various components, but the various components are not limited by these terms. The terms are used only for the purpose of distinguishing one component from another component. For example, without departing from the scope of the present invention, a second component may be referred to as a first component, and similarly, the first component may also be referred to as the second component. The term "and/or" includes a combination of a plurality of related listed items and any one item of the plurality of related listed items.

When a component is referred to as being "connected," or "coupled" to another component, it may be directly connected or coupled to another component, but it should be understood that still another component may exist between the component and another component. On the contrary, when a component is referred to as being "directly connected," or "directly coupled" to another component, it should be understood that still another component may not be present between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary should be construed as having meanings that are consistent in the context of the relevant art and are not to be interpreted as having an idealistic or excessively formalistic meaning unless clearly defined in the present application.

Hereinafter, embodiments of the present invention will be described in detail with reference to the accompanying drawings, the same reference numerals are given to the same or corresponding components regardless of drawing symbols, and a duplicate description thereof will be omitted.

FIG. 1 is a perspective view illustrating a heat conversion apparatus according to one embodiment of the present invention, FIG. 2 is a partially enlarged view illustrating the heat conversion apparatus according to one embodiment of the present invention, FIG. 3 is a cross-sectional view taken along line X-X' of FIG. 1, and FIG. 4 is an exploded view illustrating a unit module of FIG. 3. FIG. 5 is a diagram for describing a structure in which a thermoelectric module is engaged with a duct, FIG. 6 is a cross-sectional view illustrating a thermoelectric element included in the thermoelectric module according to one embodiment of the present invention, and FIG. 7 is a perspective view illustrating the thermoelectric element included in the thermoelectric module according to one embodiment of the present invention.

Referring to FIGS. 1 to 4, a heat conversion apparatus 1000 includes a plurality of ducts 1100, a plurality of first thermoelectric modules 1200, a plurality of second thermoelectric modules 1300, and a plurality of gas guide members 1400. The heat conversion apparatus 1000 according to the embodiment of the present invention may produce power using a difference in temperature between a cooling fluid flowing through the plurality of ducts 1100 and a high-temperature gas passing through separation spaces between the plurality of ducts 1100, that is, a difference in temperature between heat absorption surfaces and heat radiation surfaces of the plurality of first thermoelectric modules 1200 and the plurality of second thermoelectric modules 1300.

The plurality of ducts 1100 allow a cooling fluid to pass therethrough and are disposed to be spaced apart from each other at predetermined intervals. For example, the cooling fluid introduced into the plurality of ducts 1100 may be water, but the present invention is not limited thereto, and the cooling fluid may be one of various types of fluids having cooling performance. A temperature of the cooling fluid introduced into the plurality of ducts 1100 may be less than 100° C., preferably less than 50° C., and more preferably less than 40° C., but the present invention is not limited thereto. A temperature of a cooling fluid, which passes through the plurality of ducts 1100 and then is discharged, may be higher than that of the cooling fluid introduced into the plurality of ducts 1100. Each of the ducts 1100 includes a first surface 1110, a second surface 1120 opposite to the first surface 1110 and disposed parallel to the first surface 1110, a third surface 1130 disposed between the first surface 1110 and the second surface 1120, and a fourth surface 1140 disposed opposite to the third surface 1130 between the first surface 1110 and the second surface 1120. The cooling fluid passes through an interior of each duct formed of the first surface 1110, a second surface 1120, a third surface 1130, and a fourth surface 1140. The cooling fluid is introduced into cooling fluid inlets of the plurality of ducts 1100 and discharged through cooling fluid outlets thereof. In order to support the plurality of ducts 1100 and allow the cooling fluid to be easily introduced and discharged, an inlet support member 1500 and an outlet support member 1600 may be further disposed at the cooling fluid inlets and the cooling fluid outlets of the plurality of ducts 1100. Each of the inlet support member 1500 and the outlet support member 1600 has a plate shape in which a plurality of openings are formed. A plurality of openings 1510 formed in the inlet support member 1500 are formed to correspond to sizes, shapes, and positions of the cooling fluid inlets of the plurality of ducts 1100. The plurality of openings formed in the outlet support member 1600 are formed to correspond to sizes, shapes, and positions of the cooling fluid outlets of the plurality of ducts 1100.

Heat dissipation fins 1150 may be disposed on an inner wall of each duct 1100. Shapes and the number of the heat dissipation fins 1150 and an area of the heat dissipation fins 1150 occupying the inner wall of each duct 1100 may be variously changed according to a temperature of the cooling fluid, a temperature of waste heat, and a required power generation capacity. For example, an area of the heat dissipation fins 1150 occupying the inner wall of each duct 1100 may range from 1% to 40% of a cross-sectional area of each duct 1100. Thus, it is possible to obtain high thermoelectric conversion efficiency without hindering a flow of the cooling fluid.

In addition, the interior of each duct 1100 may be divided into a plurality of regions. When the interior of each duct 1100 is divided into a plurality of regions, even though a flow rate of the cooling fluid is not sufficient to fill the interior of each duct 1100, the cooling fluid may be uniformly distributed in each duct 1100 so that it is possible to obtain uniform thermoelectric conversion efficiency with respect to the entire surface of each duct 1100.

Meanwhile, the plurality of first thermoelectric modules 1200 are disposed on a first surface 1112 which is included in the first surface 1110 of each duct 1100 and disposed toward the outside of each duct 1100, and the plurality of second thermoelectric modules 1300 are disposed to be symmetrical to the plurality of first thermoelectric modules 1200 on a second surface 1122 which is included in the second surface 1120 of each duct 1100 and disposed toward the outside of each duct 1100.

In this case, the first thermoelectric module 1200 and the second thermoelectric module 1300 disposed to be symmetrical to the first thermoelectric module 1200 may be referred to as a pair of thermoelectric modules or a unit thermoelectric module.

A plurality of pairs of thermoelectric modules, that is, a plurality of unit thermoelectric modules, may be disposed on each duct 1100. For example, when m pairs of thermoelectric modules are disposed on each duct 1100 and the heat conversion apparatus 1000 includes n ducts 1100, the heat conversion apparatus 1000 may include m*n pairs of thermoelectric modules, that is, 2*m*n thermoelectric modules. In this case, the number of unit thermoelectric modules and the number of ducts may be adjusted according to a required amount of power generation.

In this case, at least some of the plurality of first thermoelectric modules 1200 connected to each duct 1100 may be electrically connected to each other using a bus bar 1800, and at least some of the plurality of second thermoelectric modules 1300 connected to each duct 1100 may be electrically connected to each other using another bus bar (not shown). For example, the bus bar 1800 may be disposed at an outlet through which a high-temperature gas passing through the separation spaces between the plurality of ducts 1100 is discharged, that is, disposed on the fourth surface 1140 of each duct 1100, and may be connected to an external terminal. Thus, without arranging a printed circuit board (PCB) for the plurality of first thermoelectric modules 1200 and the plurality of second thermoelectric modules 1300, power may be supplied to the plurality of first thermoelectric modules 1200 and the plurality of second thermoelectric modules 1300 so that it is easy to design and assemble the heat conversion apparatus.

Referring to FIG. 5, the first thermoelectric module 1200 and the second thermoelectric module 1300 may be engaged with the duct 1100 using screws S. Thus, the plurality of first thermoelectric modules 1200 and the plurality of second thermoelectric modules 1300 may be stably coupled to surfaces of the ducts 1100.

Referring to FIGS. 1 to 4 again, the first thermoelectric module 1200 and the second thermoelectric module 1300 include thermoelectric elements 1210 and 1310 disposed on the first surface 1112 and the second surface 1122, heat radiation substrates 1220 and 1320 disposed on the thermoelectric elements 1210 and 1310, and heat sinks 1230 and 1330 disposed on the heat radiation substrates 1220 and 1320. As described above, the duct 1100 in which a cooling fluid flows is disposed on one of two surfaces of each of the thermoelectric elements 1210 and 1310, and the heat radiation substrates 1220 and 1320 and the heat sinks 1230 and 1330 are disposed on the other surface, and, when a high-temperature gas passes through the heat radiation substrates 1220 and 1320 and the heat sinks 1230 and 1330, a difference in temperature between the heat absorption surface and the heat radiation surface of each of the thermoelectric elements 1210 and 1310 may be increased so that thermoelectric conversion efficiency may be increased.

In this case, aluminum substrates 1240 and 1340 may be further disposed between the first surface 1112, the second surface 1122, and thermoelectric elements 1210 and 1310 and may be bonded to the first surface 1112 and the second surface 1122 using thermal interface materials (TIMs) 1250 and 1350. Since the aluminum substrates 1240 and 1340 have excellent heat transfer performance, heat transfer between one of two surfaces of each of the thermoelectric elements 1210 and 1310 and the duct 1100 in which the cooling fluid flows is easy. In addition, when the aluminum substrates 1240 and 1340 and the duct 1100 through which the cooling fluid flows are bonded using the TIMs 1250 and 1350, heat transfer between the aluminum substrates 1240 and 1340 and the duct 1100 through which the cooling fluid flows may not be hindered.

In this case, a structure of each of the thermoelectric elements 1210 and 1310 may have a structure of a thermoelectric element 100 illustrated in FIGS. 6 and 7. Referring to FIGS. 6 and 7, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150. A pair of the P-type thermoelectric leg 130 and the N-type thermoelectric leg 140, which are disposed between the lower electrode 120 and the upper electrode 150 and electrically connected to each other, may form a unit cell.

For example, when voltages are applied to the lower electrode 120 and the upper electrode 150 through lead lines 181 and 182, a substrate in which a current flows from the P-type thermoelectric leg 130 to the N-type thermoelectric leg 140 may serve as a heat absorption surface, and a substrate in which a current flows from the N-type thermoelectric leg 140 to the P-type thermoelectric leg 130 may serve as a heat radiation surface.

Here, each of the P-type thermoelectric leg 130 and the N-type thermoelectric leg 140 may be a bismuth telluride (Bi—Te)-based thermoelectric leg containing Bi and Ti as main raw materials. The P-type thermoelectric leg 130 at 100 wt % may be a thermoelectric leg which includes 99 to 99.999 wt % Bi—Te-based main low material containing at least one among antimony (Sb), nickel (Ni), aluminum (Al), copper (Cu), silver (Ag), lead (Pb), boron (B), gallium (Ga), Te, Bi, and indium (In) and includes 0.001 to 1 wt % mixture containing Bi or Te. For example, the P-type thermoelectric leg 130 at 100 wt % may include Bi—Se—Te as the main raw material and may further include 0.001 to 1 wt % Bi or Te. The N-type thermoelectric leg 140 at 100 wt % may be a thermoelectric leg which includes 99 to 99.999 wt % Bi—Te-based low material containing at least one among selenium (Se), Ni, Al, Cu, Ag, Pb, B, Ga, Te, Bi, and In and includes 0.001 to 1 wt % mixture containing Bi or Te. For example, the N-type thermoelectric leg 140 at 100 wt % may include Bi—Sb—Te as the main raw material and may further include 0.001 to 1 wt % Bi or Te.

Each of the P-type thermoelectric leg 130 and the N-type thermoelectric leg 140 may be formed in a bulk shape or a stacked shape. Generally, a bulk-shaped P-type thermoelectric leg 130 or a bulk-shaped N-type thermoelectric leg 140 may be obtained by heat-treating a thermoelectric material to produce an ingot, crushing and sieving the ingot to obtain a thermoelectric leg powder, sintering the thermoelectric leg powder, and cutting the sintered body. A stack-shaped P-type thermoelectric leg 130 or a stack-shaped N-type thermoelectric leg 140 may be obtained by applying a paste containing a thermoelectric material on sheet-shaped substrates to form unit members, stacking the unit members, and cutting the stacked unit members.

In this case, the pair of the P-type thermoelectric leg 130 and the N-type thermoelectric leg 140 may have the same shape and volume or may have different shapes and volumes. For example, since electrical conductivity characteristics of the P-type thermoelectric leg 130 and the N-type thermoelectric leg 140 are different, a height or a cross-sectional area of the N-type thermoelectric leg 140 may be formed differently from that of the P-type thermoelectric leg 130.

Performance of a thermoelectric element according to one embodiment of the present invention may be expressed by a Seebeck index. A Seebeck index ZT may be expressed by Equation 1.

$$ZT = \alpha^2 \sigma T/k \qquad \text{[Equation 1]}$$

Here, α is a Seebeck coefficient (V/K), σ is electrical conductivity (S/m), and α2σ is a power factor (W/mK2). Further, T is a temperature, and k is thermal conductivity (W/mK). k may be expressed as a·cp·ρ, a is thermal diffusivity (cm2/S), cp is a specific heat (J/gK), and ρ is a density (g/cm3).

In order to obtain a Seebeck coefficient of a thermoelectric element, a Z value (V/K) is measured using a Z-meter, and a Seebeck index ZT may be calculated using the measured Z value.

According to an embodiment of the present invention, the P-type thermoelectric leg 130 and the N-type thermoelectric leg 140 may have a structure shown in FIG. 6B. Referring to FIG. 6B, the thermoelectric legs 130 and 140 include thermoelectric material layers 132 and 142, first plating layers 134 and 144 deposited on one surfaces of the thermoelectric material layers 132 and 142, second plating layers 134 and 144 stacked on the other surfaces which are disposed opposite to the one surfaces of the thermoelectric material layers 132 and 142, first bonding layers 136 and 146 disposed between the thermoelectric material layers 132 and 142 and the first plating layers 134 and 144 and between the thermoelectric material layers 132 and 142 and the second plating layers 134 and 144, and the first bonding layers 136 and 146 and the second metal layers 138 and 148 which are disposed on the second bonding layers 136 and 146, the first plating layers 134 and 144, and the second plating layers 134 and 144.

Here, the thermoelectric material layers 132 and 142 may include Bi and Te which are semiconductor materials. The thermoelectric material layers 132 and 142 may have the same material or shape as the P-type thermoelectric leg 130 or the N-type thermoelectric leg 140 which is described with reference to FIG. 6A.

In addition, each of the first metal layers 138 and 148 and the second metal layers 138 and 148 may be formed of a material selected from Cu, a Cu alloy, Al, and an Al alloy and may have a thickness ranging from 0.1 mm to 0.5 mm, and preferably ranging from 0.2 mm to 0.3 mm. A thermal expansion coefficient of each of the first metal layers 138 and 148 and the second metal layers 138 and 148 is similar to or greater than that of each of the thermoelectric material layers 132 and 142, and thus, during sintering, since compressive stress is applied to interfaces between the first metal layers 138 and 148, the second metal layers 138 and 148, and the thermoelectric material layers 132 and 142, cracks or delamination may be prevented. In addition, since bonding forces between the first metal layers 138 and 148, the second metal layers 138 and 148, and the electrodes 120 and 150 are large, the thermoelectric legs 130 and 140 may be stably coupled to the electrodes 120 and 150.

Next, each of the first plating layers 134 and 144 and the second plating layers 134 and 144 may include at least one among Ni, Sn, Ti, Fe, Sb, Cr, and Mo and have a thickness ranging from 1 μm to 20 μm, and preferably ranging from 1 μm to 10 μm. The first plating layers 134 and 144 and the second plating layers 134 and 144 prevent reaction between the semiconductor material Bi or Te in the thermoelectric material layers 132 and 142 and the first and second metal layers 138 and 148 so that degradation in performance may be prevented and oxidation of the first metal layers 138 and 148 and the second metal layers 138 and 148 may be prevented.

In this case, the first bonding layers 136 and 146 and the second bonding layers 136 and 146 may be disposed between the thermoelectric material layers 132 and 142 and the first plating layers 134 and 144 and between the thermoelectric material layers 132 and 142 and the second plating layers 134 and 144. In this case, each of the first bonding layers 136 and 146 and the second bonding layers 136 and 146 may include Te. For example, each of the first bonding layers 136 and 146 and the second bonding layers 136 and 146 may include at least one among Ni—Te, Sn—Te, Ti—Te, Fe—Te, Sb—Te, Cr—Te, and Mo—Te. According to an embodiment of the present invention, a thickness of each of the first bonding layers 136 and 146 and the second bonding layers 136 and 146 may range from 0.5 μm to 100 μm, and preferably from 1 μm to 50 μm. According to an embodiment of the present invention, the first bonding layers 136 and 146 and the second bonding layers 136 and 146, which include Te, are disposed in advance between the thermoelectric material layers 132 and 142, the first plating layers 134 and 144, and the second plating layers 134 and 144 so that it is possible to prevent Te in the thermoelectric material layers 132 and 142 from diffusing to the first plating layers 134 and 144 and the second plating layers 134 and 144. Consequently, occurrence of a Bi-rich region may be prevented.

Meanwhile, the lower electrode 120 disposed between the lower substrate 110, the P-type thermoelectric leg 130, and the N-type thermoelectric leg 140, and the upper electrode 150 disposed between the upper substrate 160, the P-type thermoelectric leg 130, and the N-type thermoelectric leg 140 may each include at least one among Cu, Ag, and Ni and may each have a thickness ranging from 0.01 mm to 0.3 mm. When the thickness of the lower electrode 120 or the upper electrode 150 is less than 0.01 mm, a function as an electrode is lowered and thus electrical conduction performance may be degraded, and, when the thickness thereof exceeds 0.3 mm, conduction efficiency may be degraded due to an increase in resistance.

In addition, the lower substrate 110 and the upper substrate 160 opposite to each other may be insulating substrates or metal substrates. The insulating substrate may be an alumina substrate or a polymer resin substrate having flexibility. The polymer resin substrate having flexibility may include one of various insulating resin materials such as high permeability plastic and the like including polyimide (PI), polystyrene (PS), polymethyl methacrylate (PMMA), cyclic olefin copoly (COC), polyethylene terephthalate (PET), and a resin. The metal substrate may include Cu, a Cu alloy, or a Cu—Al alloy, and a thickness of the metal substrate may range from 0.1 mm to 0.5 mm. When the thickness of the metal substrate is less than 0.1 mm or exceeds 0.5 mm, a heat radiation characteristic or thermal conductivity may be excessively high so that reliability of the thermoelectric element may be degraded. In addition, when the lower substrate 110 and the upper substrate 160 are metal substrates, a dielectric layer 170 may be further formed between the lower substrate 110 and the lower electrode 120 and between the upper substrate 160 and the upper electrode 150. The dielectric layer 170 may include a material having thermal conductivity ranging from 5 W/K to 10 W/K and may be formed to have a thickness ranging from 0.01 mm to 0.15 mm. When the thickness of the dielectric layer 170 is less than 0.01 mm, insulation efficiency or a withstanding voltage characteristic may be degraded, and, when the thickness thereof exceeds 0.15 mm, thermal conductivity may be lowered and thus heat radiation efficiency may be degraded.

In this case, sizes of the lower substrate 110 and the upper substrate 160 may be formed to be different from each other. For example, a volume, a thickness, or an area of one among the lower substrate 110 and the upper substrate 160 may be formed to be larger than that of the other one thereamong. Consequently, heat absorbing performance or heat radiation performance of the thermoelectric element may be improved.

In addition, a heat radiation pattern, e.g., an irregular pattern, may be formed on at least one surface of either the lower substrate 110 or the upper substrate 160. Consequently, the heat radiation performance of the thermoelectric element may be improved. When the irregular pattern is formed on a surface in contact with the P-type thermoelectric leg 130 or the N-type thermoelectric leg 140, a bonding characteristic between the thermoelectric leg and the substrate may also be improved.

Meanwhile, the P-type thermoelectric leg 130 or the N-type thermoelectric leg 140 may have a cylindrical shape, a polygonal column shape, an elliptical column shape, or the like.

According to one embodiment of the present invention, a portion of the P-type thermoelectric leg 130 or the N-type thermoelectric leg 140 to be bonded to the electrode may be formed to have a wide width.

Alternatively, according to another embodiment of the present invention, the lower substrate 110 and the upper substrate 160 may be omitted.

Referring to FIGS. 1 to 4 again, one gas guide member 1400 may be disposed in each duct 1100 or a plurality of gas guide members 1400 may be disposed in each duct 1100. The gas guide member 1400 may be disposed in a direction in which a high-temperature gas is guided. For example, when the third surface 1130 of each duct 1100 is directed toward the direction in which the high-temperature gas introduced and the fourth surface 1140 thereof is disposed to face a direction in which the high-temperature gas passes through the separation spaces between the plurality of ducts 1100 and then is discharged, the gas guide member 1400 may be disposed on the third surface 1130 of each duct 1100.

In this case, a temperature of a gas introduced into the separation spaces between the plurality of ducts 1100 is higher than that of a gas discharged from the separation spaces therebetween. For example, the gas introduced into the separation spaces between the plurality of ducts 1100 may be waste heat generated from an engine of a vehicle, a ship, or the like, but the present invention is not limited thereto. For example, the temperature of the gas introduced into the separation spaces between the plurality of ducts 1100 may be 100° C. or higher, preferably 200° C. or higher, and more preferably in a range of 220° C. to 250° C., but the present invention is not limited thereto. In this case, a width of each of the separation spaces between the plurality of ducts 1100 may range from several millimeters to several tens of millimeters and may be varied according to a size of the heat conversion device, the temperature of the gas being introduced, an inflow velocity of the gas, and a required amount of power generation.

One end 1410 of the gas guide member 1400 may be connected to the first thermoelectric module 1200 and may extend to be spaced apart from the third surface 1132 on the third surface 1132 included in the third surface 1130 of each duct 1100 and facing the outside of each duct 1100, and the other end 1420 thereof may be connected to the second thermoelectric module 1300. Thus, a high-temperature gas, e.g., waste heat, may pass through the separation spaces between the plurality of ducts 1100 through the gas guide member 1400.

In this case, the gas guide member 1400 may be formed in a unit of a pair of the thermoelectric modules 1200 and 1300 or formed in a unit of a plurality of pairs of the thermoelectric modules 1200 and 1300 consecutively disposed on one duct 1100.

An extended surface 1430 between the one end 1410 and the other end 1420 of the gas guide member 1400 may have a shape in which a distance from the third surface 1130 is increased toward a center between the one end 1410 and the other end 1420. That is, the extended surface 1430 of the gas guide member 1400 may have an umbrella shape or a roof shape. Thus, the high-temperature gas may be guided to pass through the separation spaces between the plurality of ducts 1100.

In addition, when the extended surface 1430 of the gas guide member 1400 has an umbrella shape or a roof shape, air gaps are formed between the gas guide member 1400 and a side surface of the first thermoelectric module 1200 and between the third surface 1130 and a side surface of the second thermoelectric module 1300 so that heat insulation performance may be improved.

Here, the one end 1410 of the gas guide member 1400 is connected to the heat sink 1230 of the first thermoelectric module 1200, and the other end 1420 thereof is connected to the heat sink 1330 of the second thermoelectric module 1300 so that sealing may be achieved. Accordingly, since the high-temperature gas passing between the plurality of ducts 1100 passes only the heat radiation substrates 1220 and 1320 and the heat sinks 1230 and 1330 of the first thermoelectric module 1200 and the second thermoelectric module 1300, it is possible to prevent a problem in that the high-temperature gas comes into direct contact with the thermoelectric elements 1210 and 1220 included in the first thermoelectric module 1200 and the second thermoelectric module 1300, and it is possible to achieve heat insulation between the gas guide member 1400 and the side surface of the first thermoelectric module 1200 and between the third surface 1130 and the side surface of the second thermoelectric module 1300 so that a problem of degradation in thermoelectric conversion performance may be prevented.

In order to further enhance the sealing and insulation effects of the first thermoelectric module 1200, the third surface 1130 of each duct 1100, and the second thermoelectric module 1300, the side surfaces of the plurality of first thermoelectric modules 1200, the side surfaces of the plurality of second thermoelectric modules 1300, and the surfaces of the ducts 1100 disposed between the side surfaces of the plurality of first thermoelectric modules 1200 and the side surface of the plurality of second thermoelectric modules 1300 may be integrally sealed using a sealant 1700.

In order to further enhance the sealing and insulation effects of the first thermoelectric module 1200, the third surface 1130 of each duct 1100, and the second thermoelectric module 1300, an insulating member may be disposed between the gas guide member 1400 and the side surface of the first thermoelectric module 1200 and between the third surface 1130 and the side surface of the second thermoelectric module 1300.

FIG. 8 shows a perspective view and a cross-sectional view illustrating a gas guide member according to another embodiment of the present invention.

Referring to FIG. 8, an auxiliary guide part 1440 may be further disposed between the one end 1410 and the extension part 1430 of the gas guide member 1400 and between the other end 1420 and the extension part 1430 of the gas guide member 1400, and a hole H may be further formed in a region in which the auxiliary guide part 1440 is in contact with the extension part 1430. In this case, the auxiliary guide part 1440 may be formed in a shape symmetrical to the extension part 1430. Thus, the high-temperature gas may move along the extension part 1430 and may be efficiently guided to the separation spaces between the plurality of ducts 1100 through the hole H.

In addition, a groove 1450 may be further formed in a surface of the extension part 1430 of the gas guide member 1400. Thus, the high-temperature gas may move along the groove 1450 formed in a surface of the extension part 1430 and may be efficiently guided to the separation spaces between the plurality of ducts 1100 through the hole H.

In addition, as shown in FIG. 8C, the auxiliary guide part 1440 may extend parallel to the one end 1410 or the other end 1420 of the gas guide member 1400. When the auxiliary guide part 1440 extends, the high-temperature gas may be efficiently guided to the thermoelectric module.

In addition, although not shown in the drawings, an angle between the one end 1410 and the extension part 1430 may be equal to an angle between the other end 1420 and the extension part 1430, and each of the angles may be larger than 90° and smaller than 180°, and preferably larger than 110° and smaller than 160°. When the angle is smaller than 90° or larger than 180°, a flow of waste heat is hindered so that heat transfer efficiency may be degraded.

In addition, although not shown in the drawings, a central portion of the extension part 1430 of the gas guide member 1400 may have a predetermined angle, and the predetermined angle may be smaller than the angle between the one end 1410 and the extension part 1430. Similarly, the predetermined angle may be smaller than the angle between the other end 1420 and the extension part 1430. The predetermined angle of the central portion of the extension part 1430 may be larger than 110° and smaller than 160°, and preferably, larger than 120° and smaller than 150°. When the predetermined angle of the central portion of the extension part 1430 is smaller than 11° or larger than 160°, a flow of waste heat is hindered, and thus thermoelectric conversion efficiency may be degraded.

Although the description has been made with reference to the exemplary embodiments of the present invention, it should be understood that various alternations and modifications of the present invention can be devised by those skilled in the art to which the present invention pertains without departing from the spirit and scope of the present invention, which are defined by the appended claims.

The invention claimed is:

1. A power generation apparatus comprising:
a duct through which a first fluid passes;
a first thermoelectric module disposed on a first surface of the duct;
a second thermoelectric module disposed on a second surface opposite to the first surface of the duct; and
a guide member disposed on an end of the duct spaced apart from a third surface of the duct, wherein the third surface is disposed between the first surface and the second surface, the guide member faces an inlet of a second fluid,
wherein the guide member includes:
a first end proximate to the first thermoelectric module;
a second end proximate to the second thermoelectric module; and
an extension part disposed between and connecting the first end to the second end;
wherein the extension part has a shape in which a distance from the extension part to the third surface is increased in a direction toward a center of the guide member between the first and second ends;
a first auxiliary guide member disposed on the first end of the guide member such that a first opening is formed between the first auxiliary guide member and the first end of the guide member;
a second auxiliary guide member is disposed on the second end of the guide member such that a second opening is formed between the second auxiliary guide member and the second end of the guide member;
wherein the first and second openings allow a second fluid which moves along a surface of the extension part facing away from the third surface to pass through the first and second openings.

2. The power generation apparatus of claim 1, wherein: the first auxiliary guide member and the second auxiliary guide member are symmetrically formed about the center of the guide member.

3. The power generation apparatus of claim 1, wherein the first auxiliary guide member is parallel to the first end.

4. The power generation apparatus of claim 1, wherein: each of the first thermoelectric module and the second thermoelectric module includes a plurality of thermoelectric elements, heat radiation substrates disposed on the thermoelectric elements, and heat sinks disposed on the heat radiation substrates; and each thermoelectric element of the plurality of thermoelectric elements includes a first electrode, a second electrode, and a semiconductor device disposed between the first electrode and the second electrode.

5. The power generation apparatus of claim 4, wherein each of the first and second thermoelectric modules comprise an aluminum substrate positioned between the plurality of thermoelectric elements and the duct, wherein the aluminum substrate is bonded to the duct using a thermal interface material (TIM).

6. The power generation apparatus of claim 5, wherein the first end of the guide member is disposed on the heat sink of the first thermoelectric module, and the second end of the guide member is disposed on the heat sink of the second thermoelectric module.

7. The power generation apparatus of claim 1, wherein an airgap is formed between the guide member and the third surface.

8. The power generation apparatus of claim 1, wherein an insulating member is disposed between the guide member and the third surface.

9. The power generation apparatus of claim 1, wherein the first thermoelectric module and the second thermoelectric module are coupled to the duct using a screw.

10. The power generation apparatus of claim 1, further comprising a sealing member disposed between the guide member and the third surface.

* * * * *